(12) United States Patent
Contreras et al.

(10) Patent No.: US 11,361,786 B1
(45) Date of Patent: Jun. 14, 2022

(54) DATA STORAGE DEVICE EMPLOYING AMPLIFIER FEEDBACK FOR IMPEDANCE MATCHING

(71) Applicant: Western Digital Technologies, Inc., San Jose, CA (US)

(72) Inventors: John T. Contreras, Palo Alto, CA (US); Joey M. Poss, Rochester, MN (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/180,998

(22) Filed: Feb. 22, 2021

Related U.S. Application Data

(60) Provisional application No. 63/116,218, filed on Nov. 20, 2020.

(51) Int. Cl.
*G11B 20/10* (2006.01)
*G11B 5/012* (2006.01)
*H03F 3/45* (2006.01)
*H03F 1/56* (2006.01)
*G11B 5/127* (2006.01)

(52) U.S. Cl.
CPC .............. *G11B 5/012* (2013.01); *G11B 5/127* (2013.01); *H03F 1/56* (2013.01); *H03F 3/45183* (2013.01); *H03F 2203/45454* (2013.01); *H03F 2203/45468* (2013.01); *H03F 2203/45576* (2013.01)

(58) Field of Classification Search
CPC ......... G11B 5/00; G11B 20/0013; G11B 5/02; G11B 20/10027; G11B 5/035; G11B 20/10; G11B 5/09
USPC ......................................... 360/67, 65, 68, 46
See application file for complete search history.

(56) References Cited

U.S. PATENT DOCUMENTS

| | | | |
|---|---|---|---|
| 6,356,152 | B1 | 3/2002 | Jezdic et al. |
| 7,092,180 | B2 * | 8/2006 | Franck ..................... G11B 5/09 327/317 |
| 7,190,214 | B2 | 3/2007 | Barnett et al. |
| 7,251,091 | B2 | 7/2007 | Takeuchi et al. |
| 7,667,914 | B2 | 2/2010 | Contreras et al. |
| 8,599,506 | B2 | 12/2013 | Contreras et al. |
| 8,792,198 | B1 | 7/2014 | Straub et al. |
| 9,312,818 | B2 | 4/2016 | Mattisson et al. |
| 10,056,098 | B1 | 8/2018 | Rajauria et al. |
| 2006/0152838 | A1 | 7/2006 | Fitzgerald et al. |
| 2010/0110578 | A1 | 5/2010 | Amemiya |

* cited by examiner

*Primary Examiner* — Nabil Z Hindi
(74) *Attorney, Agent, or Firm* — Patterson + Sheridan, LLP; Steven H. VerSteeg

(57) ABSTRACT

A data storage device is disclosed comprising a head actuated over a magnetic media, wherein the head comprises a read element configured to generate a read signal when reading data from the magnetic media. A common-source common-gate (CS-CG) differential amplifier is coupled to the read element through a transmission line having a transmission line impedance $Z_0$. A feedback circuit is coupled between an output of the CS-CG differential amplifier and an input of the CS-CG differential amplifier, wherein the feedback circuit is configured so that an input impedance of the CS-CG differential amplifier substantially matches the transmission line impedance $Z_0$.

22 Claims, 6 Drawing Sheets

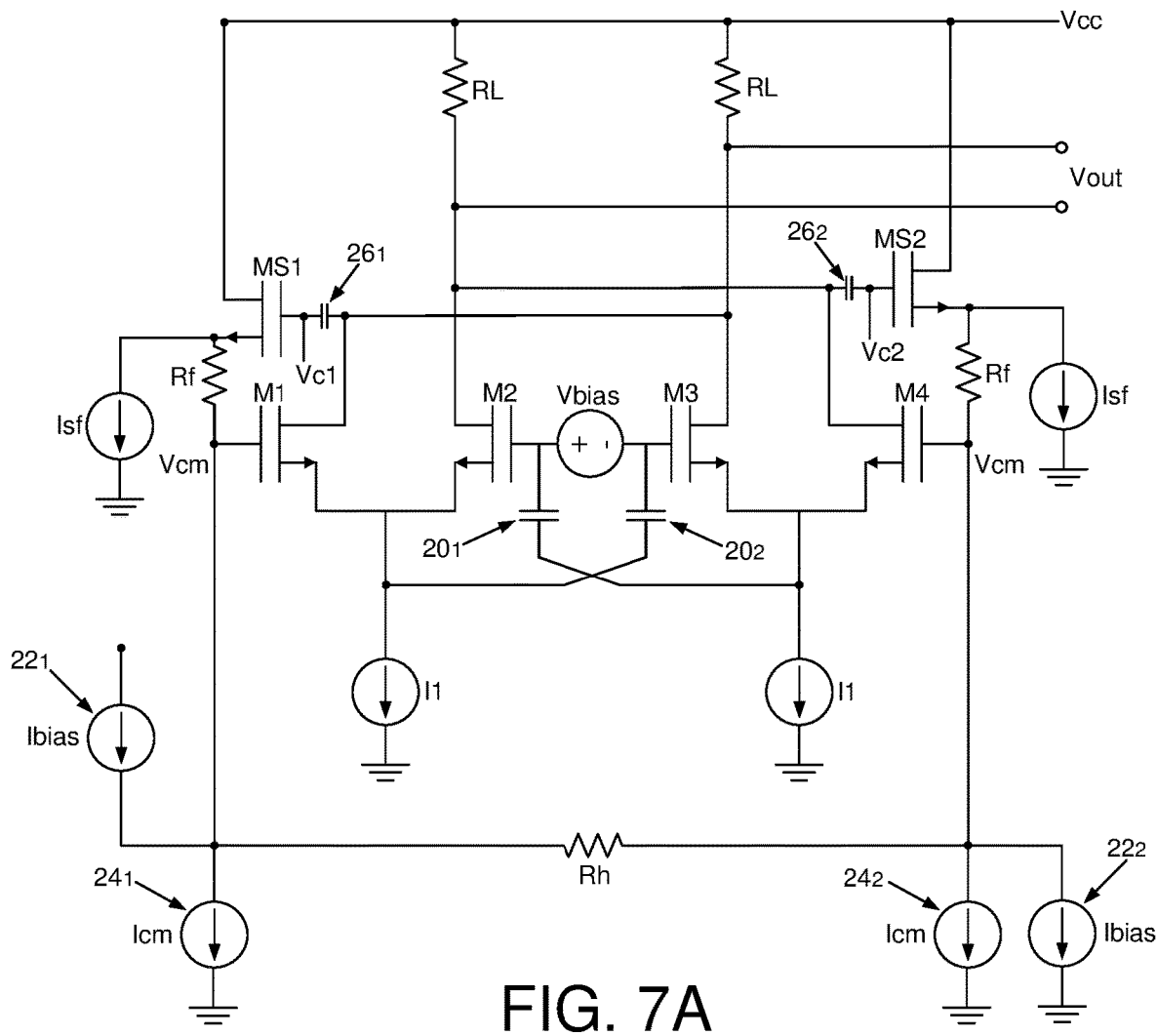
FIG. 7A
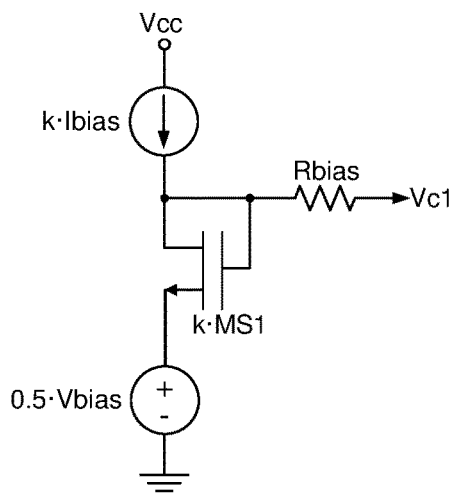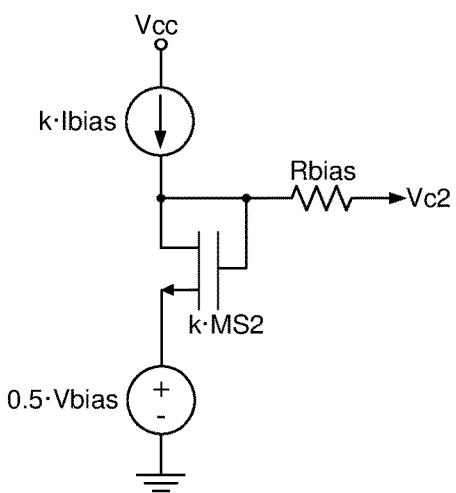
FIG. 7B  FIG. 7C

DATA STORAGE DEVICE EMPLOYING AMPLIFIER FEEDBACK FOR IMPEDANCE MATCHING

CROSS REFERENCE TO RELATED APPLICATIONS

This application claims priority to U.S. Provisional Patent Application Ser. No. 63/116,218, filed on Nov. 20, 2020, which is hereby incorporated by reference in its entirety.

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

Data is typically written to the disk by modulating a write current in an inductive coil to record magnetic transitions onto the disk surface in a process referred to as saturation recording. During read-back, the magnetic transitions are sensed by a read element (e.g., a magneto-resistive element) and the resulting read signal demodulated by a suitable read channel. Heat assisted magnetic recording (HAMR) is a recent development that improves the quality of written data by heating the disk surface during write operations in order to decrease the coercivity of the magnetic medium, thereby enabling the magnetic field generated by the write coil to more readily magnetize the disk surface. Any suitable technique may be employed to heat the surface of the disk in HAMR recording, such as by fabricating a laser diode and a near field transducer (NFT) with other write components of the head. Microwave assisted magnetic recording (MAMR) is also a recent development that improves the quality of written data by using a spin torque oscillator (STO) to apply a high frequency auxiliary magnetic field to the media close to the resonant frequency of the magnetic grains, thereby enabling the magnetic field generated by the write coil to more readily magnetize the disk surface.

BRIEF DESCRIPTION OF THE DRAWINGS

FIG. 7A shows an embodiment wherein the gate of a pseudo floating source follower feedback circuit is AC coupled to the output of the CS-CG differential amplifier through a capacitor.

FIGS. 7B and 7C show an embodiment of a biasing circuit configured to bias a gate and source voltage of the pseudo floating source follower feedback circuits.

DETAILED DESCRIPTION

Figure 1A:
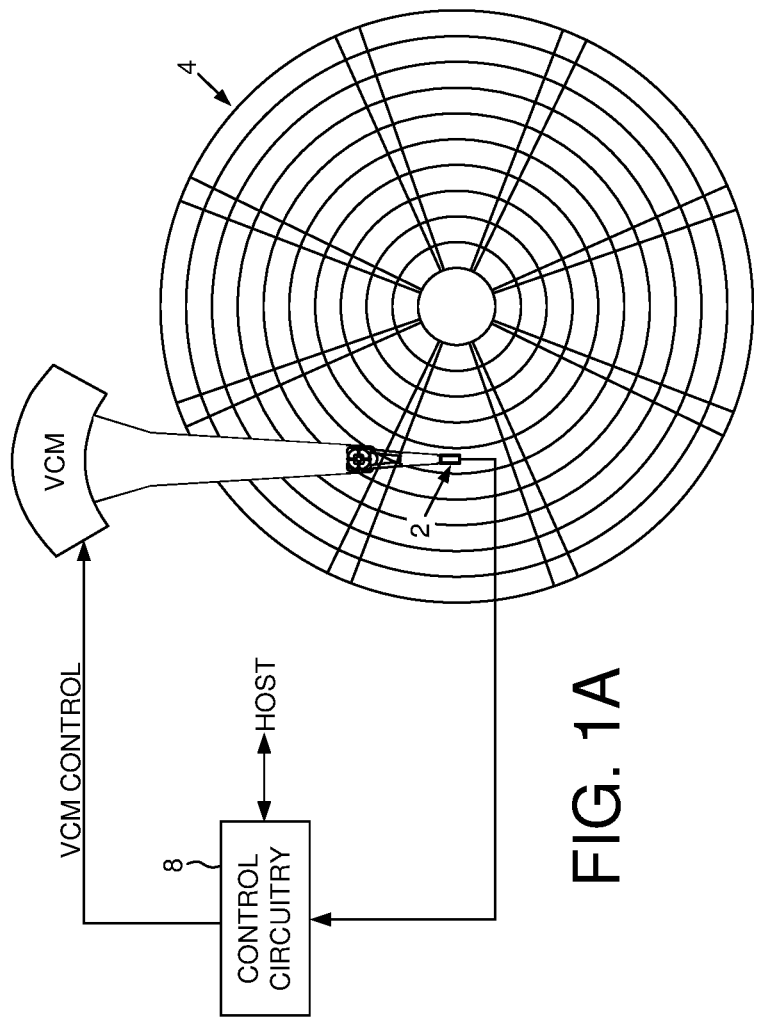
FIGS. 1A and 1B show a data storage device in the form of a disk drive comprising a head actuated over a disk, and control circuitry coupled to a read element of the head through a transmission line.
Figure 1B:
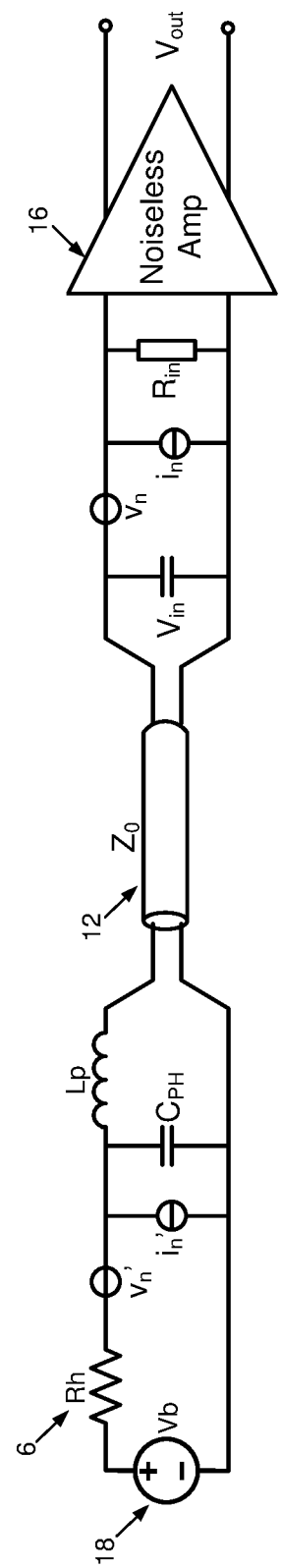

FIGS. 1A and 1B show a data storage device in the form of a disk drive according to an embodiment comprising a head 2 actuated over a magnetic media such as a disk 4, wherein the head 2 comprises a read element 6 configured to generate a read signal when reading data from the disk 4. While a disk drive is used as an illustrative example herein, various embodiments of the invention may be applied to, and/or include, other types of data storage device with magnetic media such as tape drives. The data storage device further comprises control circuitry 8 comprising a common-source common-gate (CS-CG) differential amplifier 10 (e.g., FIG. 3A) coupled to the read element 6 through a transmission line 12 having a transmission line impedance $Z_0$. The control circuitry 8 further comprises a feedback circuit (e.g., feedback circuit 14₁ of FIG. 3A) coupled between an input and output of the CS-CG differential amplifier 10, wherein the feedback circuit is configured so that an input impedance of the CS-CG differential amplifier 10 substantially matches the transmission line impedance $Z_0$.

FIG. 1B shows a block diagram of an ideal (noiseless) amplifier 16 configured to amplify the read signal generated by the read element 6. In this embodiment, the read element (e.g., a magnetoresistive element) generates an AC read signal representing resistance variation of the read element caused by the varying magnetic flux on the disk 4. A DC offset is imposed at the input of the amplifier 16 in order to apply a bias voltage across the read element 6. The output Vout of the ideal amplifier 16 will include a signal component and a noise component, wherein the noise component may be due to the extent the ideal amplifier 16 amplifies a noise (voltage $V_n$ and current $i_n$) of a non-ideal amplifier and a noise (voltage $V'_n$ and current $i'_n$) from the read element 6 and the media. In addition to the noise component reducing the signal-to-noise ratio (SNR) of the read signal, the impedance $Z_0$ of the transmission line may cause an amplitude and/or phase distortion of the read signal (output signal Vout) dependent on the input impedance of the amplifier 16.

Figure 2A:
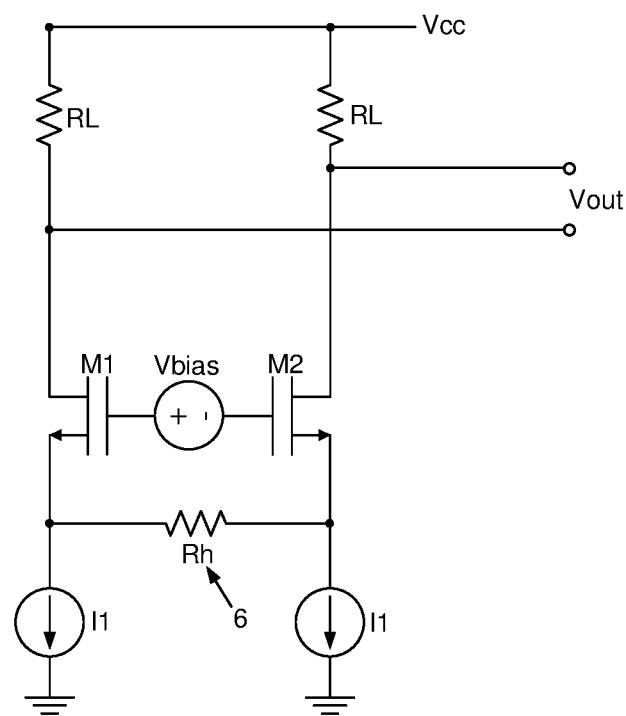
FIG. 2A shows a prior art common-gate (CG) amplifier configured to apply a bias voltage across a read element of the head and to sense changes in current flowing through the read element when reading data from the disk.
Figure 2B:
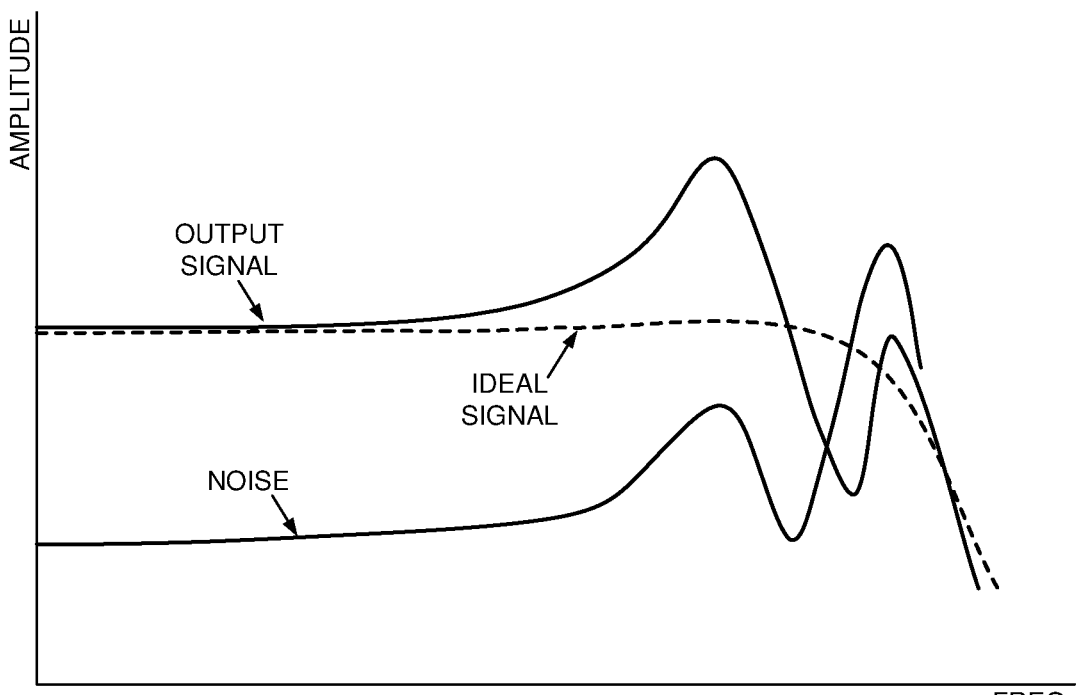
FIG. 2B shows a signal and noise frequency response of the CG amplifier, including a noise peaking due to a resonance of the transmission line.

FIG. 2A shows a prior art common-gate (CG) amplifier configured to apply a bias voltage Vbias across a read element 6 of the head and to sense changes in current flowing through the read element 6 when reading data from the disk. The noise of this CG amplifier is proportional to its input impedance such that decreasing the noise means decreasing the input impedance. However as shown in FIG. 2B, decreasing the input impedance of the CG amplifier can cause distortion in the output signal due to a signal transferring through the transmission line having an un-matched termination. In one embodiment, the signal transmission line resonance (and noise peaking) is attenuated as shown in FIG. 3B by matching the input impedance of a CS-CG differential amplifier to the transmission line impedance $Z_0$ using a feedback circuit such as shown in FIG. 3A and by decreasing the voltage noise of the amplifier.

Any suitable CS-CG differential amplifier 10 may be employed in the embodiments described herein. FIG. 4 shows an embodiment of a CS-CG differential amplifier including an inner CG amplifier and an outer CS amplifier. The CG amplifier comprises a bias voltage Vbias coupled between the gates of field effect transistors M2 and M3 in order to apply Vbias across the read element Rh. In one embodiment, the Vbias applied to the gates (and across the read element Rh) is generated with a common mode voltage (DC offset from ground) and a differential mode voltage (difference in voltage between the gates and across the read element Rh). The CS amplifier comprises field effect transistors M1 and M4 having their respect gates connected to the ends of the read element Rh. In this embodiment, each feedback circuit $14_i$ of FIG. 3A comprises a feedback resistor Rf connected between the respective output and the respective input of the CS-CG differential amplifier. In this embodiment, the feedback resistor Rf may be configured so that the input impedance of the CS-CG differential amplifier substantially matches the transmission line impedance $Z_0$ without significantly increasing the noise of the amplifier. Also in this embodiment, the noise of the amplifier is further reduced by cross-coupling the sources and drains of the CS and CG amplifiers as shown in FIG. 4. A further reduction in noise is achieved by cross-coupling the sources through respective capacitors $20_1$ and $20_2$. In other embodiments, the sources of the CS and CG amplifiers may be cross-coupled directly (without using capacitors), and in yet other embodiments, the CS and CG amplifiers may be implemented without cross-coupling the sources and/or without cross-coupling the drains.

Figure 5:
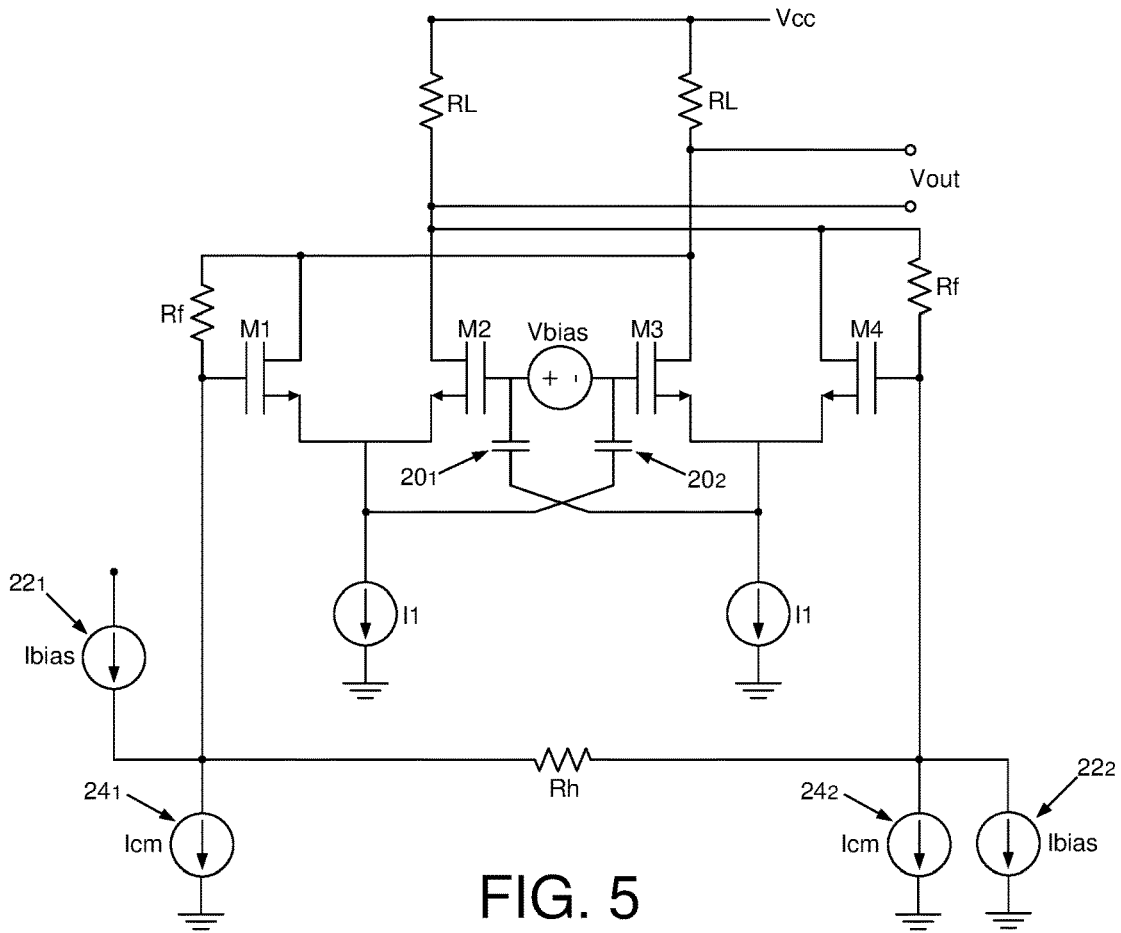
FIG. 5 shows an embodiment of a CS-CG differential amplifier comprising a first feedback loop configured to control a differential voltage of the read element and a second feedback loop configured to control a common mode voltage of the read element.

FIG. 5 shows an embodiment wherein differential and common mode current sources are used to bias the input of the CS-CG differential amplifier. In this embodiment, the differential current sources $22_1$ and $22_2$ apply a bias current Ibias to the read element Rh in order to zero the DC differential output voltage Vout of the CS-CG differential amplifier due to biasing the read element Rh with the bias voltage Vbias. The common mode current sources $24_1$ and $24_2$ are configured so that the common mode voltage applied to the read element Rh is near the ground potential, thereby preventing damage to the read element Rh.

Figure 3A:
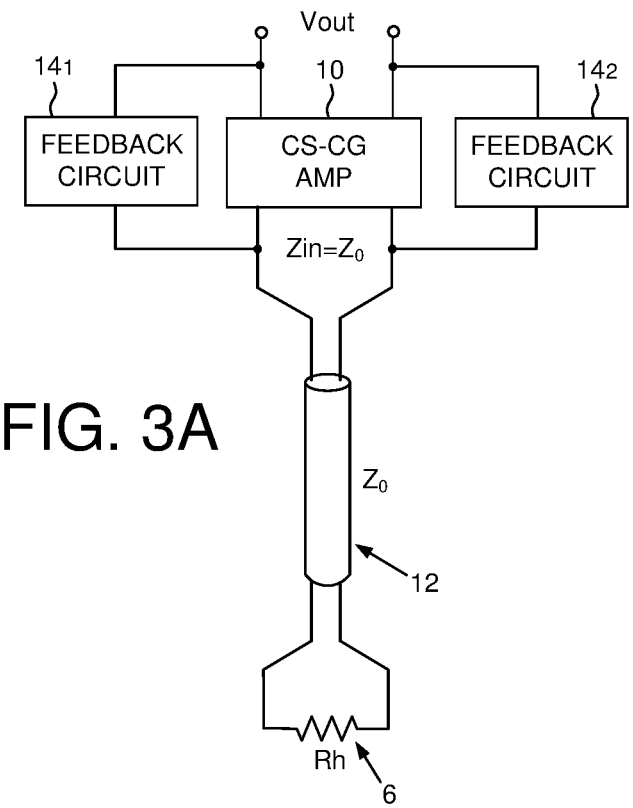
FIG. 3A shows an embodiment wherein the control circuitry comprises a common-source common-gate (CS-CG) differential amplifier having a feedback circuit configured so that an input impedance of the CS-CG differential amplifier substantially matches the transmission line impedance $Z_0$.
Figure 3B:
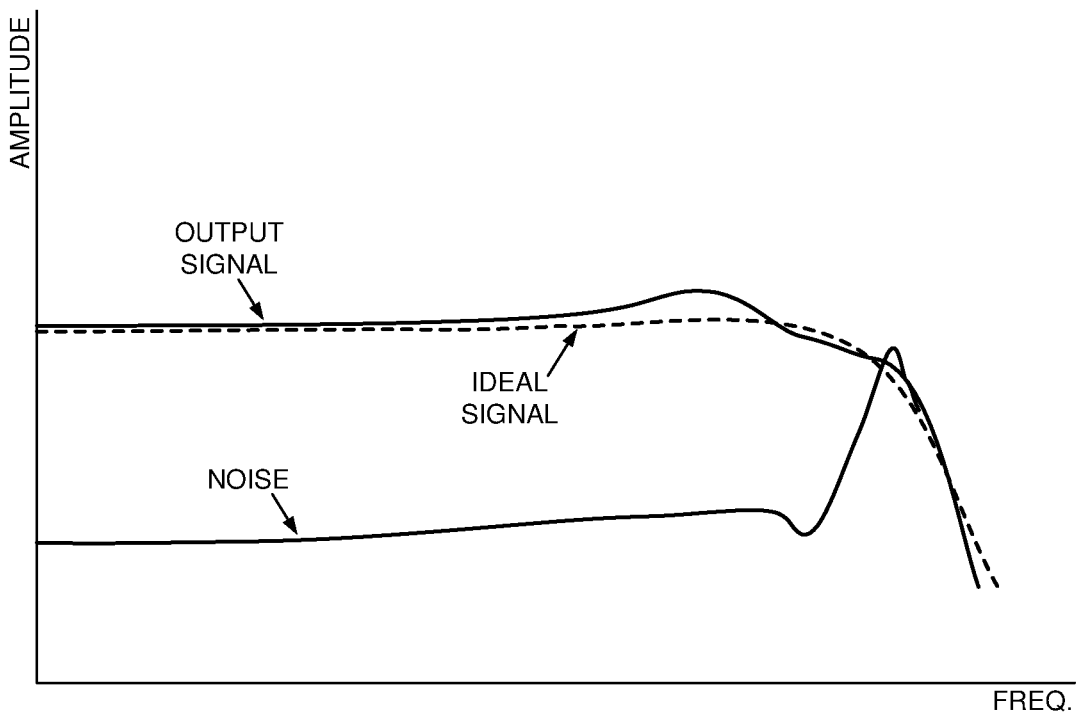
FIG. 3B shows attenuation of the noise peaking of a CS-CG differential amplifier due to matching the input impedance to the transmission line impedance $Z_0$.
Figure 4:
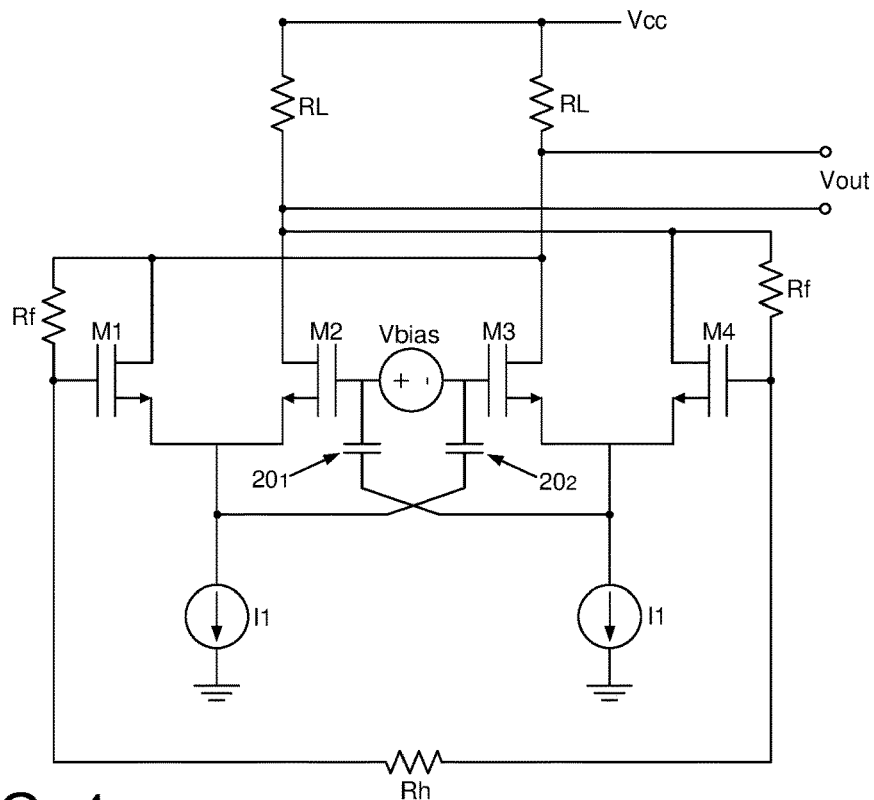
FIG. 4 shows an embodiment of a CS-CG differential amplifier wherein the feedback circuit comprises a feedback resistor coupled between the input and output of the CS-CG differential amplifier.
Figure 6A:
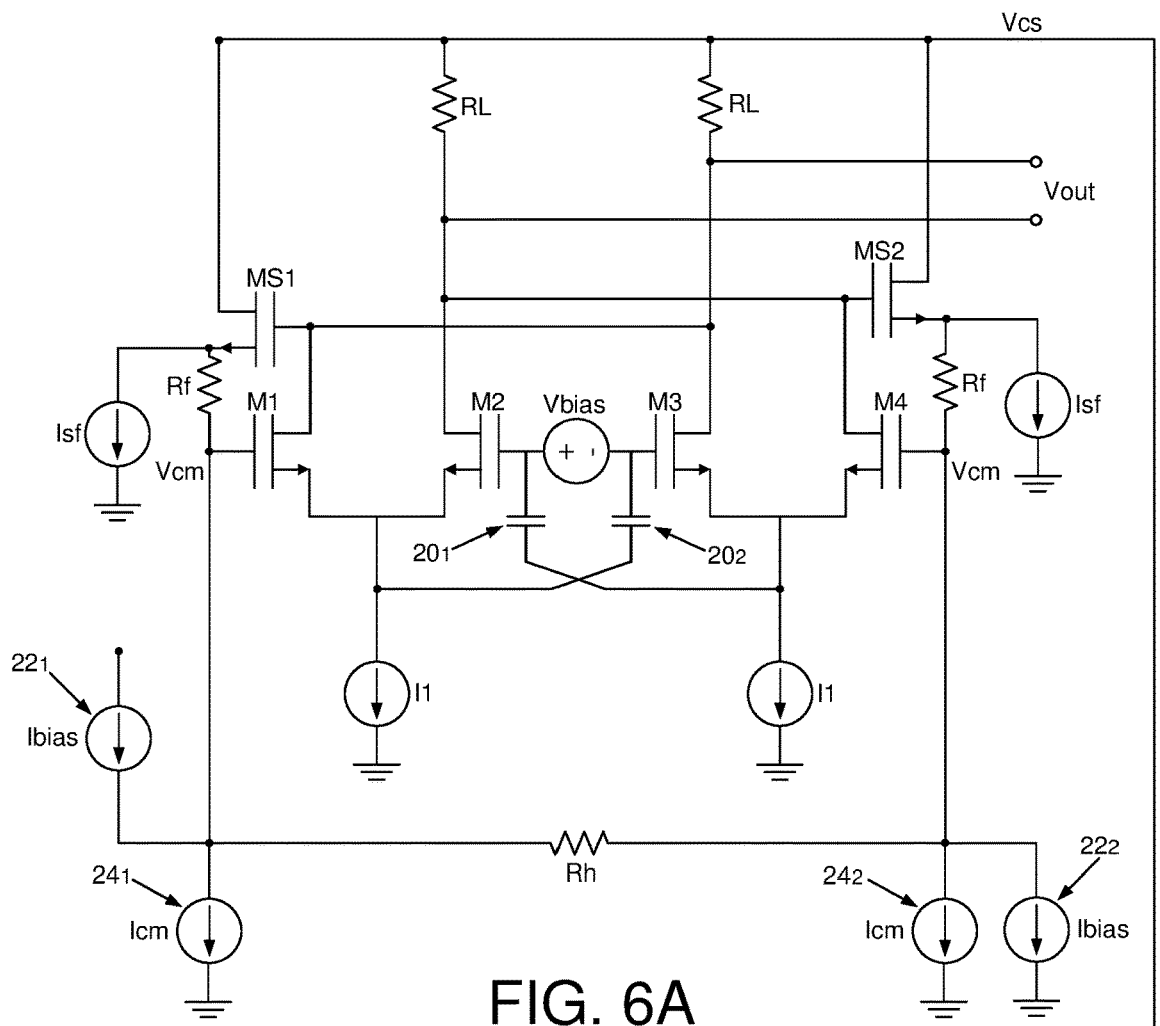
FIG. 6A shows an embodiment of a CS-CG differential amplifier wherein the feedback circuit comprises a source follower circuit comprising a gate coupled to an output of the CS-CG differential amplifier and a source coupled to the feedback resistor.

FIG. 6A shows an embodiment of a CS-CG differential amplifier wherein each feedback circuit $14_i$ of FIG. 3A comprises a source follower circuit which decouples the feedback resistor Rf from the output of the amplifier (and reduces the loading effect). Each source follower circuit comprises a field effect transistor MS1 and MS2 matched to the respective transistors M1 and M4 of the CS amplifier. In this embodiment, each field effect transistor MS1 and MS2 comprises a gate directly coupled to the respective output of the CS-CG differential amplifier and a source coupled to the respective feedback resistor Rf. Each source follower circuit further comprises a current source Isf coupled to the source of the field effect transistor MSi in order to configure the input impedance of the source follower circuit. In one embodiment, a biasing circuit biases the source voltage of the source follower circuits to substantially match the common mode input voltage Vcm of the CS-CG differential amplifier (wherein the common mode voltage Vcm is set by the bias voltage Vbias of the CG amplifier). This embodiment sets the common mode output voltage of the amplifier so as to configure the operating linearity and range of the amplifier. FIG. 6D shows an embodiment of a biasing circuit configured to regulate the supply voltage Vcs applied to the CS-CG differential amplifier at a level that biases the source voltage of the source follower circuits to substantially match the common mode input voltage Vcm of the amplifier. In this embodiment, the current source I1/k and the field effect transistor MS1/k' may be scaled by the scalars k and k' (where k'=Isf/I1*k) in order to reduce the power consumption of the biasing circuit. In the embodiment of FIG. 6D, the common-mode voltage Vcm of the biasing circuit is configured as the average of the bias voltage Vbias of the CG amplifier. In another embodiment, the offset voltage Voffset of the biasing circuit may be increased slightly (Vcm+K) so as to adjust the common supply voltage Vcs to increase the linearity or voltage head for input transistors of the CS-CG differential amplifier, M1 and M4.

Figure 6B:
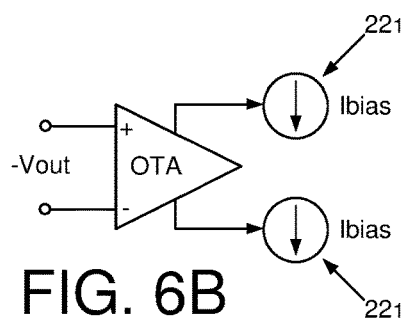
FIG. 6B shows an embodiment wherein the first feedback loop for controlling the differential voltage of the read element adjusts a differential bias current until the amplifier output voltage reaches zero at the quiescent state.
Figure 6C:
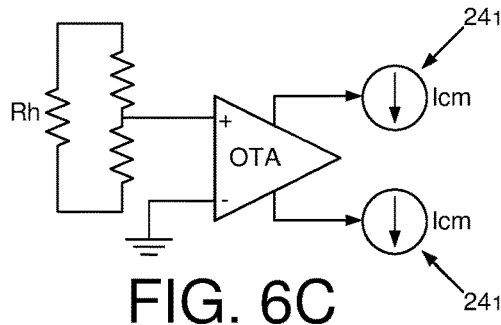
FIG. 6C shows an embodiment wherein the second feedback loop for controlling the common mode voltage of the read element adjusts a common mode bias current until the common mode voltage substantially equals the ground potential at the quiescent state.
Figure 6D:
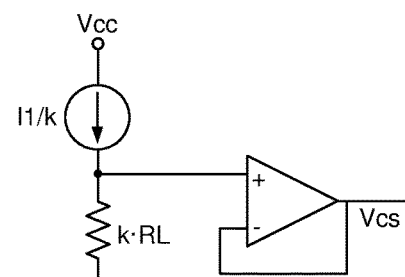
FIG. 6D shows an embodiment of a biasing circuit configured to bias a source voltage of the source follower feedback circuit to substantially match a common mode input voltage at the input of the CS-CG differential amplifier.
Figure 6D:

FIG. 6B shows an embodiment wherein the differential current sources $22_1$ and $22_2$ generate the bias current Ibias using an operational transconductance amplifier (OTA) operating as a negative feedback loop which drives the quiescent output voltage Vout of the CS-CG differential amplifier to zero. FIG. 6C shows an embodiment wherein the common mode current sources $24_1$ and $24_2$ generate the common mode currents Icm using an operational transconductance amplifier (OTA) operating as a negative feedback loop which drives the quiescent common mode voltage of the read element Rh to ground.

FIG. 7A shows an embodiment wherein the gate of each source follower circuit is AC coupled to the respective output of the CS-CG differential amplifier through a respective capacitor $26_1$ and $26_2$. FIGS. 7B and 7C show an embodiment of a biasing circuit for biasing the gate and source voltage of the source follower circuits, where the scalar k may reduce the power consumption of the biasing circuit. The current source generates a bias current (scaled bias current Ibias of current source 22i), and the voltage source configures an offset voltage to be half of the differential bias voltage applied across the read element Rh (i.e., half of the differential voltage generated by Vbias of the CG amplifier).

Any suitable control circuitry may be employed to implement the above described embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable power circuit(s) and/or a suitable preamp circuit(s) implemented as separate integrated circuits, integrated into the read channel or data storage controller circuit, or integrated into a SOC.

In one embodiment, the control circuitry comprises a microprocessor executing instructions, the instructions being operable to cause the microprocessor to perform at least some aspects described herein. The instructions may be stored in any computer-readable medium. In one embodiment, they may be stored on a non-volatile semiconductor memory external to the microprocessor, or integrated with the microprocessor in a SOC. In yet another embodiment, the control circuitry comprises suitable logic circuitry, such as state machine circuitry. In some embodiments, at least some of the flow diagram blocks may be implemented using analog circuitry (e.g., analog comparators, timers, etc.), and in other embodiments at least some of the blocks may be implemented using digital circuitry or a combination of analog/digital circuitry.

In addition, any suitable electronic device, such as computing devices, data server devices, media content storage devices, tape drives, etc. may comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a magnetic media;
a head actuated over the magnetic media, wherein the head comprises a read element configured to generate a read signal when reading data from the magnetic media;
a common-source common-gate (CS-CG) differential amplifier coupled to the read element through a transmission line having a transmission line impedance $Z_0$; and
a feedback circuit coupled between an output of the CS-CG differential amplifier and an input of the CS-CG differential amplifier, wherein the feedback circuit is configured so that an input impedance of the CS-CG differential amplifier substantially matches the transmission line impedance $Z_0$.

2. The data storage device as recited in claim 1, wherein the feedback circuit comprises a feedback resistor having a first end coupled to the input of the CS-CG differential amplifier.

3. The data storage device as recited in claim 2, wherein the feedback circuit further comprises a source follower circuit comprising a gate coupled to the output of the CS-CG differential amplifier and a source coupled to a second end of the feedback resistor.

4. The data storage device as recited in claim 3, wherein the gate of the source follower circuit is coupled to the output of the CS-CG differential amplifier through a capacitor.

5. The data storage device as recited in claim 3, further comprising a biasing circuit configured to bias a source voltage of the source follower circuit to substantially match a common mode input voltage at the input of the CS-CG differential amplifier.

6. The data storage device as recited in claim 1, wherein the CS-CG differential amplifier comprises:
a CG differential amplifier comprising common gates; and
a bias voltage applied between the common gates of the CG differential amplifier in order to apply the bias voltage across the read element.

7. The data storage device as recited in claim 6, wherein the CG differential amplifier further comprises cross-coupled sources.

8. The data storage device as recited in claim 7, wherein the sources of the CG differential amplifier are cross-coupled through respective capacitors.

9. The data storage device as recited in claim 6, wherein the CS-CG differential amplifier further comprises a CS differential amplifier comprising:
first and second inputs coupled to respective ends of the read element through the transmission line; and
first and second drains cross-coupled to first and second drains of the CG differential amplifier.

10. A data storage device comprising:
a magnetic media;
a head actuated over the magnetic media, wherein the head comprises a read element configured to generate a read signal when reading data from the magnetic media;
a common-source common-gate (CS-CG) differential amplifier coupled to the read element through a transmission line;
a source follower feedback circuit coupled between an output of the CS-CG differential amplifier and an input of the CS-CG differential amplifier; and
a biasing circuit configured to bias a source voltage of the source follower feedback circuit to substantially match a common mode input voltage at the input of the CS-CG differential amplifier.

11. The data storage device as recited in claim 10, wherein the source follower feedback circuit is configured so that an input impedance of the CS-CG differential amplifier substantially matches a transmission line impedance $Z_0$ of the transmission line.

12. The data storage device as recited in claim 10, wherein the source follower feedback circuit comprises a feedback resistor having a first end coupled to the input of the CS-CG differential amplifier and a second end coupled to a source of the source follower feedback circuit.

13. The data storage device as recited in claim 12, wherein the source follower feedback circuit further comprises a gate coupled to the output of the CS-CG differential amplifier.

14. The data storage device as recited in claim 13, wherein the gate of the source follower feedback circuit is coupled to the output of the CS-CG differential amplifier through a capacitor.

15. The data storage device as recited in claim 10, wherein the CS-CG differential amplifier comprises:
    a CG differential amplifier comprising common gates; and
    a bias voltage applied between the common gates of the CG differential amplifier in order to apply the bias voltage across the read element.

16. The data storage device as recited in claim 15, wherein the CG differential amplifier further comprises cross-coupled sources.

17. The data storage device as recited in claim 16, wherein the sources of the CG differential amplifier are cross-coupled through respective capacitors.

18. The data storage device as recited in claim 15, wherein the CS-CG differential amplifier further comprises a CS differential amplifier comprising:
    first and second inputs coupled to respective ends of the read element through the transmission line; and
    first and second drains cross-coupled to first and second drains of the CG differential amplifier.

19. Control circuitry comprising:
    a common-source common-gate (CS-CG) differential amplifier configured to be coupled to a read element of a head of a data storage device through a transmission line having a transmission line impedance $Z_0$; and
    a feedback circuit coupled between an output of the CS-CG differential amplifier and an input of the CS-CG differential amplifier, wherein the feedback circuit is configured so that an input impedance of the CS-CG differential amplifier substantially matches the transmission line impedance $Z_0$.

20. The control circuitry as recited in claim 19, wherein the CS-CG differential amplifier comprises:
    a CG differential amplifier comprising common gates; and
    a bias voltage applied between the common gates of the CG differential amplifier in order to apply the bias voltage across the read element.

21. Control circuitry comprising:
    a common-source common-gate (CS-CG) differential amplifier configured to be coupled to a read element of a head of a data storage device through a transmission line;
    a source follower feedback circuit coupled between an output of the CS-CG differential amplifier and an input of the CS-CG differential amplifier; and
    a biasing circuit configured to bias a source voltage of the source follower feedback circuit to substantially match a common mode input voltage at the input of the CS-CG differential amplifier.

22. The control circuitry as recited in claim 21, wherein the CS-CG differential amplifier comprises:
    a CG differential amplifier comprising common gates; and
    a bias voltage applied between the common gates of the CG differential amplifier in order to apply the bias voltage across the read element.

* * * * *